(12) United States Patent
Lee

(10) Patent No.: US 10,670,931 B2
(45) Date of Patent: Jun. 2, 2020

(54) DISPLAY DEVICE AND METHOD OF MANUFACTURING THE SAME

(71) Applicant: Samsung Display Co., Ltd., Yongin-si (KR)

(72) Inventor: Chang Soo Lee, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/215,538

(22) Filed: Dec. 10, 2018

(65) Prior Publication Data

US 2019/0278123 A1  Sep. 12, 2019

(30) Foreign Application Priority Data

Mar. 8, 2018 (KR) .................. 10-2018-0027401

(51) Int. Cl.
| | | |
|---|---|---|
| *G02F 1/1345* | (2006.01) | |
| *H01L 27/12* | (2006.01) | |
| *H01L 25/18* | (2006.01) | |
| *H01L 23/498* | (2006.01) | |
| *H01L 25/00* | (2006.01) | |
| *H01L 27/32* | (2006.01) | |

(52) U.S. Cl.
CPC ...... *G02F 1/13452* (2013.01); *G02F 1/13458* (2013.01); *H01L 23/49811* (2013.01); *H01L 25/18* (2013.01); *H01L 25/50* (2013.01); *H01L 27/124* (2013.01); *H01L 27/3276* (2013.01); *H01L 23/4985* (2013.01)

(58) Field of Classification Search
None
See application file for complete search history.

(56) References Cited

U.S. PATENT DOCUMENTS

2017/0358602 A1* 12/2017 Bae .................. H05K 1/117

FOREIGN PATENT DOCUMENTS

| KR | 10-2015-0011731 | 2/2015 |
| KR | 10-1736930 | 5/2017 |

* cited by examiner

*Primary Examiner* — James A Dudek
(74) *Attorney, Agent, or Firm* — H.C. Park & Associates, PLC

(57) ABSTRACT

A display device includes: a first substrate having a top surface and a first side surface extending from the top surface; a second substrate facing the first substrate and having a second side surface aligned with the first side surface; substrate signal pads disposed on the first side surface; substrate dummy pads disposed on the second side surface; a circuit film facing the first and second side surfaces; circuit dummy pads disposed on the circuit film and electrically connected to the substrate dummy pads; and circuit signal pads disposed on the circuit film and electrically connected to the substrate signal pads.

19 Claims, 12 Drawing Sheets

DISPLAY DEVICE AND METHOD OF MANUFACTURING THE SAME

CROSS-REFERENCE TO RELATED APPLICATION

This application claims priority from and the benefit of Korean Patent Application No. 10-2018-0027401, filed on Mar. 8, 2018, which is hereby incorporated by reference for all purposes as if fully set forth herein.

BACKGROUND

Field

Exemplary embodiments of the invention relate generally to a display device and a method of manufacturing the same and, more specifically, to the configuration of pad connections between the display panel and the driving circuit board.

Discussion of the Background

Display devices have increasingly become important in accordance with developments in multimedia technology. Accordingly, various types of display devices such as a liquid crystal display (LCD) device, an organic light-emitting display device, etc. have been used.

The LCD device, which is one of the most widely-used flat panel displays, includes two substrates on which field-generating electrodes such as pixel electrodes and a common electrode are formed and a liquid crystal layer which is interposed between the two substrates. The LCD device forms an electric field in the liquid crystal layer by applying voltages to the field-generating electrodes so as to determine the orientation of liquid crystal molecules in the liquid crystal layer, and displays an image by controlling the polarization of light incident thereupon using the electric field.

The organic light-emitting display device displays an image using light-emitting diodes (OLEDs), which generate light through the recombination of electrons and holes. The organic light-emitting display device has many advantages such as fast response speed, high luminance, wide viewing angle, and low power consumption.

A display device inevitably includes an area in which no image is displayed (non-display area) in order to drive an area in which an image (display area) is displayed. Since a display device having a narrow bezel can be realized by reducing the size of the non-display area, various research has been vigorously conducted on ways to reduce the size of the non-display area.

The above information disclosed in this Background section is only for understanding of the background of the inventive concepts, and, therefore, it may contain information that does not constitute prior art.

SUMMARY

Display devices constructed according to exemplary embodiments of the invention have a narrow bezel.

Methods of manufacturing a display device according to the principles and exemplary embodiments of the invention produce a display device having a narrow bezel.

The narrow bezel may be achieved through a more efficient arrangement of connection pads that reduce the width of the bezel compared to conventional pad configurations. For example, according to exemplary embodiments of the invention, signal and dummy pads in the display area and in the driving circuit film may be arranged in a stacked configuration on the sides of the display substrate to reduce the space needed in the non-display area. Accordingly, a display device having a narrow bezel can be realized.

According to another aspect of the invention, the circuit film may be attached to the sides of the substrates by coupling not only substrate signal pads and the circuit signal pads CSP, but also the circuit dummy pads and the substrate dummy pads, e.g., using an anisotropic conductive film, the first and second substrates and the circuit film can be stably bonded together, i.e., the bonding force between the first and second substrates and the circuit film CF can be improved. Accordingly, a display device having a narrow bezel and improved durability can be realized.

Additional features of the inventive concepts will be set forth in the description which follows, and in part will be apparent from the description, or may be learned by practice of the inventive concepts.

According to an exemplary embodiment of the invention, a display device includes: a first substrate having a top surface and a first side surface extending from the top surface; a second substrate facing the first substrate and having a second side surface adjacent with the first side surface; first pads disposed on the first side surface; at least one second pads disposed on the second side surface; a circuit film facing the first and second side surfaces; third pads disposed on the circuit film and electrically connected to the at least one second pads; and fourth pads disposed on the circuit film and electrically connected to the first pads.

The display device may further include an anisotropic conductive film disposed between the circuit film and the first substrate and the second substrate.

The third pads and the at least one second pads may be electrically connected via the anisotropic conductive film.

The display device may further include upper signal lines disposed on the top surface, wherein the upper signal lines are electrically connected to the first pads.

The display device may further include a driver integrated circuit disposed on the circuit film and electrically connected to the fourth pads.

A display area and a non-display area are defined on the top surface, wherein the non-display area is disposed on the outside of the display area, the upper signal lines may be disposed in the non-display area, and signals generated by the driver integrated circuit may be provided to the display area via the fourth pads, the first pads, and the upper signal lines.

The at least one second pads and the third pads may be insulated from the display area.

The display device may further include side signal lines extending from the first pads, wherein the side signal lines are placed in contact with the upper signal lines.

The at least one second pads may have a larger width than the first pads.

The at least one second pad may include a single bar extending in a longitudinal direction.

The first pads may include substrate signals pads, the at least one second pad may include at least one substrate dummy pad, the third pads may include circuit dummy pads and the fourth pads may include circuit signal pads.

The display device may further include organic light-emitting diodes (OLEDs) or a liquid crystal layer disposed between the first and second substrates.

According to an exemplary embodiment of the invention, a method of manufacturing a display device includes the steps of: attaching a first substrate, having a top surface and a first side surface extending from the top surface to a bottom surface, a second substrate, having a second side surface adjacent with the first side surface; forming substrate signal pads on the first side surface and forming at least one substrate dummy pad on the second side surface; and attaching a circuit film, which includes circuit signal pads connected to the substrate signal pads and circuit dummy pads connected to the at least one substrate dummy pad, to the first side surface and the second side surface.

The step of attaching the circuit film to the first side surface and second side surface, may include interposing an anisotropic conductive film between the circuit film and the first side surface and second side surface.

The circuit dummy pads and the at least one substrate dummy pad may be electrically connected via the anisotropic conductive film.

The display device may include upper signal lines disposed on the top surface, and the upper signal lines may be electrically connected to the substrate signal pads.

A driver integrated circuit, which is electrically connected to the circuit signal pads, may be disposed on the circuit film.

The at least one substrate dummy pad may have a larger width than the substrate signal pads.

The at least one substrate dummy pad may include a single substrate dummy pad formed as a bar extending in a longitudinal direction.

The substrate signal pads and the circuit signal pads may be formed of the same material at the same time by the same process.

According to the aforementioned and other exemplary embodiments of the invention, a display device having a narrow bezel and/or improved durability or stability can be realized.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
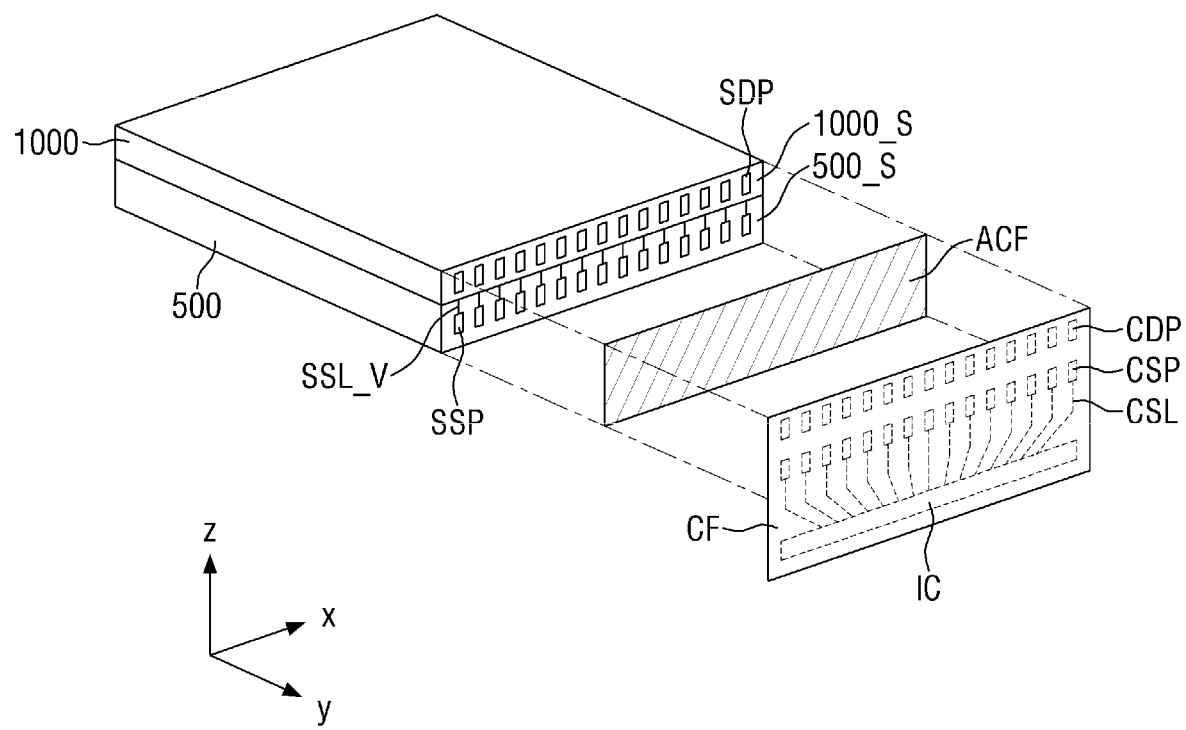
FIG. 1 is a perspective view of a display device constructed according to an exemplary embodiment of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, embodiments of the invention will be described with reference to the attached drawings.

Figure 2:
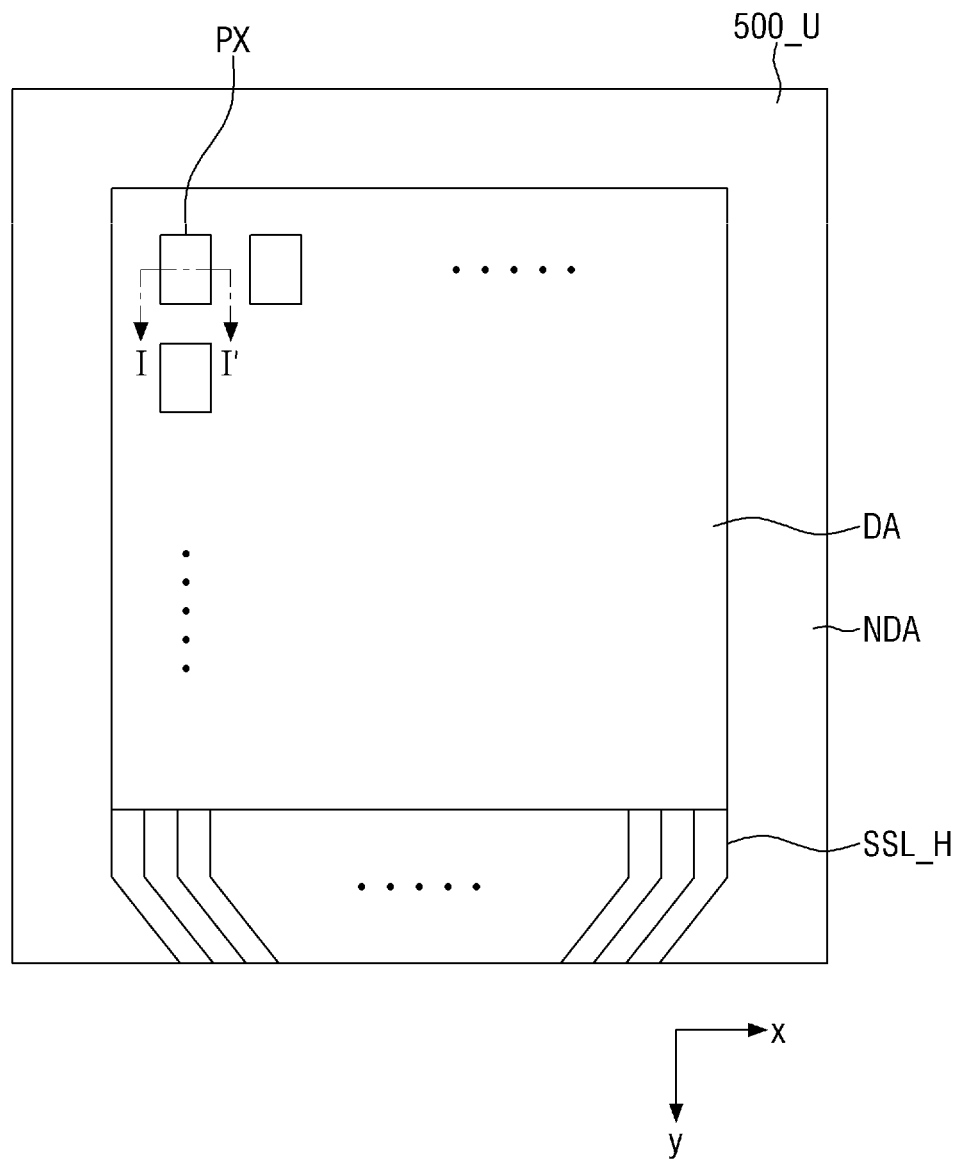
FIG. 2 is a partial layout view of the display device of FIG. 1.
Figure 3:
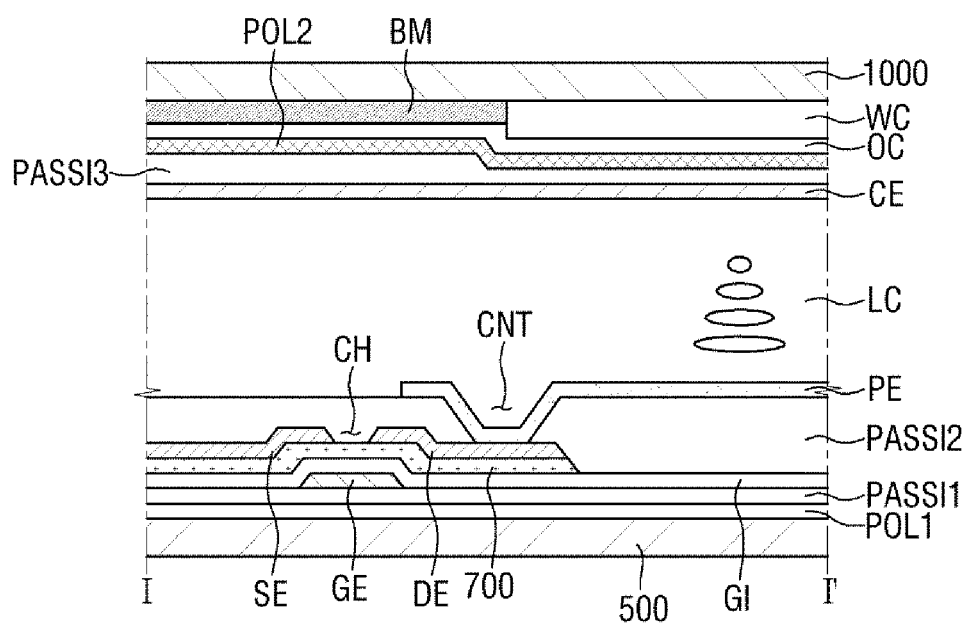
FIG. 3 is a cross-sectional view taken along line I-I' of FIG. 2.
Figure 4:
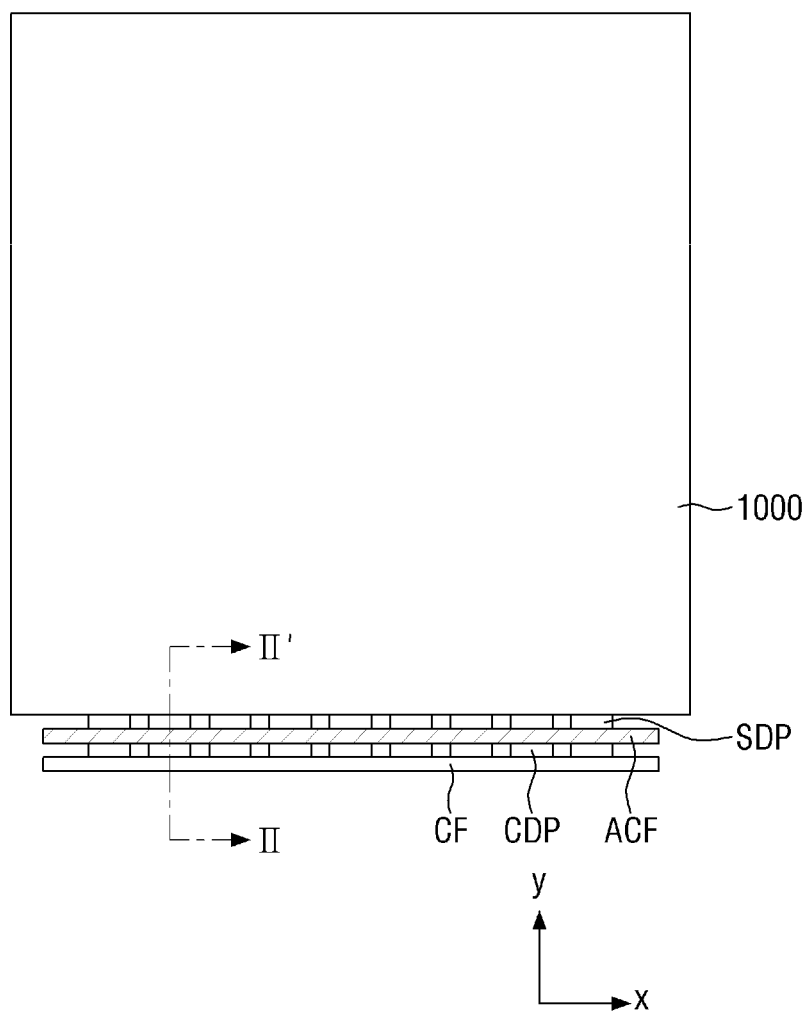
FIG. 4 is a plan view of the display device according to an exemplary embodiment of the invention.
Figure 5:
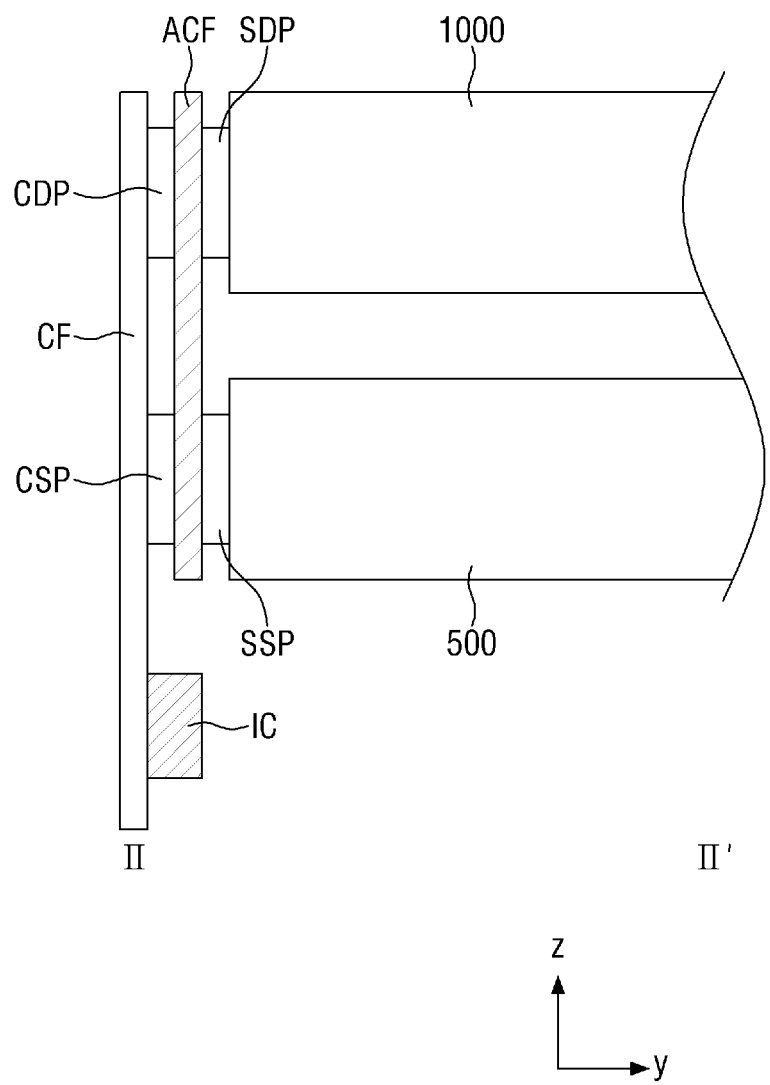
FIG. 5 is a cross-sectional view taken along line II-IF of FIG. 4.

FIG. 1 is a perspective view of a display device constructed according to an exemplary embodiment of the invention. FIG. 2 is a partial layout view of the display device of FIG. 1. FIG. 3 is a cross-sectional view taken along line I-I' of FIG. 2. FIG. 4 is a plan view of the display device according to an exemplary embodiment of the invention. FIG. 5 is a cross-sectional view taken along line II-IF of FIG. 4.

Referring to FIGS. 1 through 5, the display device according to an exemplary embodiment of the invention includes a first substrate 500, which has a top surface 500_U and a first side surface 500_S extending from the top surface 500_U, a second substrate 1000, which has a second side surface 1000_S aligned so as to be generally flush with the first side surface 500_S, substrate signal pads SSP, which are disposed on the first side surface 500_S, substrate dummy pads SDP, which are disposed on the second side surface 1000_S, a circuit film CF, which faces the first and second side surfaces 500_S and 1000_S, and circuit signal pads CSP, which are disposed on the circuit film CF and are electrically connected to the substrate signal pads SSP.

The first substrate 500 may be formed of a material having heat resistance and transparency. The first substrate 500 may be formed of, for example, transparent glass or plastic, but the material of the first substrate 500 is not particularly limited.

The first substrate 500 may have the top surface 500_U and at least one side surface extending from the top surface 500_U. For convenience, one of a plurality of side surfaces of the first substrate 500 will hereinafter be referred to as the first side surface 500_S.

In one exemplary embodiment, the top surface 500_U may be generally parallel to an x-y plane of FIG. 1, and the first side surface 500_S may be generally parallel to an x-z plane of FIG. 1.

The top surface 500_U will hereinafter be described with reference to FIG. 2. Referring to FIG. 2, a display area DA and a non-display area NDA may be defined on the top surface 500_U.

The display area DA is an area in which an image is displayed, and the non-display area NDA is an area in which various signal lines are disposed for the display of an image in the display area DA.

In the non-display area NDA, upper signal lines SSL_H may be disposed. The upper signal lines SSL_H may be signal lines transmitting signals necessary for driving the display area DA. That is, the upper signal lines SSL_H may be electrically connected to the display area DA and the substrate signal pads SSP and may thus serve as paths via which necessary signals are transmitted to the display area DA and the substrate signal pads SSP.

The upper signal lines SSL_H may be formed from a conductive metal material.

The upper signal lines SSL_H may extend to an end (in the example of FIG. 2, a lower end) of the top surface 500_U. As a result, the upper signal lines SSL_H may be placed in contact with side signal lines SSL_V or the substrate signal pads SSP. Accordingly, the upper signal lines SSL_H may be electrically connected to the side signal lines SSL_V and/or the substrate signal pads SSP.

The display device according to an exemplary embodiment of the invention may be a liquid crystal display (LCD) device. FIGS. 2 and 3 illustrate an example in which the display device is an LCD device, but the exemplary embodiments are not limited to this example.

In the display device DA, a plurality of pixels PX may be defined.

In one exemplary embodiment, the pixels PX may be arranged in a matrix having a plurality of rows and a plurality of columns.

The pixels PX will hereinafter be described with reference to FIG. 3. FIG. 3 is a partial cross-sectional view of a pixel PX.

Referring to FIG. 3, a first polarizing layer POL1 may be disposed on the first substrate 500. The first polarizing layer POL1 may polarize light provided by a backlight unit, which is disposed below the first substrate 500. Specifically, the first polarizing layer POL1 may only transmit light vibrating in a particular direction therethrough and may absorb or reflect other light.

In one exemplary embodiment, the first polarizing layer POL1 may be a polarizing film including a polymer resin stretched in a particular direction and a light-absorbing material absorbing light vibrating in the particular direction. In another exemplary embodiment, the first polarizing film POL1 may be formed as a metal layer and may absorb or reflect some light while transmitting other light therethrough. In yet another exemplary embodiment, the first polarizing film POL1 may be a polarizing layer to which a wire grid polarizer (WGP) is applied.

FIG. 3 illustrates an example in which the first polarizing layer POL1 is disposed on one surface of the first substrate 500, but the exemplary embodiments are not limited to this example. In another example, the first polarizing layer POL1 may be disposed on the other surface of the first substrate 500.

A first passivation film PASSI1 may be disposed on the first polarizing layer POL1. The first passivation film PASSI1 may include an inorganic insulating material. For example, the first passivation film PASSI1 may be formed of silicon oxide, silicon nitride, silicon oxynitride, aluminum oxynitride, titanium oxynitride, zirconium oxynitride, hafnium oxynitride, tantalum oxynitride, or tungsten oxynitride, but the material of the first passivation film PASSI1 is not particularly limited.

A gate electrode GE may be disposed on the first passivation film PASSI1. The gate electrode GE may form the three terminals of a thin-film transistor (TFT) along with source and drain electrodes SE and DE that will be described later.

The gate electrode GE may include at least one of an aluminum (Al)-based metal, including an Al alloy, a silver (Ag)-based metal, including an Ag alloy, a copper (Cu)-based metal, including a Cu alloy, a molybdenum (Mo)-based metal, including a Mo alloy, chromium (Cr), titanium (Ti), and tantalum (Ta), but the material of the gate electrode GE is not particularly limited. That is, a metal or a polymer material having a performance required to realize a desired display device may be used to form the gate electrode GE.

The gate electrode GE may be a single film, but the exemplary embodiments are not limited thereto. That is, alternatively, the gate electrode GE may be a double film, a triple film, or a multilayer film.

A gate insulating film GI may be disposed on the gate electrode GE. The gate insulating film GI may be formed on the entire surface of the first substrate 500 to cover gate wiring (GL and GE).

The gate insulating film GI may be formed by mixing at least one selected from the group consisting of an inorganic insulating material such as silicon oxide (SiOx) or silicon nitride (SiNx) and an organic insulating material such as benzocyclobutene (BCB), an acrylic material, or polyimide (PI), but the exemplary embodiments are not limited thereto. That is, the material of the gate insulating film GI is not particularly limited.

A semiconductor pattern layer 700 may be disposed on the gate insulating film GI.

The semiconductor pattern layer 700 may include amorphous silicon or polycrystalline silicon, but the exemplary embodiments are not limited thereto. That is, alternatively, the semiconductor pattern layer 700 may include an oxide semiconductor.

The semiconductor pattern layer 700 may have various shapes such as an island shape or a linear shape. In a case where the semiconductor pattern layer 700 has an island shape, the semiconductor pattern layer 700 may be disposed below a data line and may extend to the top of the gate electrode GE.

In one exemplary embodiment, in an entire region except for a channel portion CH, the semiconductor pattern layer 700 may be patterned into substantially the same shape as data wiring (SE and DE) that will be described later.

In other words, in the entire region except for the channel portion CH, the semiconductor pattern layer 700 may be disposed to overlap with the data wiring (SE and DE).

The channel portion CH may be disposed between a source electrode SE and a drain electrode DE, which face each other. The channel portion CH electrically connects the source electrode SE and the drain electrode DE, and the shape of the channel portion CH is not particularly limited.

An ohmic contact layer, which is doped with a high concentration of n-type impurities, may be disposed on the semiconductor pattern layer 700. The ohmic contact layer may overlap with the entire semiconductor pattern layer 700 or part of the semiconductor pattern layer 700. The ohmic contact layer may not be provided in an exemplary embodiment where the semiconductor pattern layer 700 includes an oxide semiconductor.

In a case where the semiconductor pattern layer 700 includes an oxide semiconductor, the semiconductor pattern layer 700 may include zinc oxide (ZnO). In one exemplary embodiment, ions of at least one of gallium (Ga), indium (In), tin (Sn), zirconium (Zr), hafnium (Hf), cadmium (Cd), Ag, Cu, germanium (Ge), gadolinium (Gd), Ti and vanadium (V) may be doped on the semiconductor pattern layer 700. For example, the semiconductor pattern layer 700 may include at least one oxide semiconductor selected from the group consisting of ZnO, ZnGaO, ZnInO, ZnSnO, GaInZnO, CdO, InO, GaO, SnO, AgO, CuO, GeO, GdO, HfO, TiZnO, InGaZnO, and InTiZnO. However, the type of the oxide semiconductor contained in the semiconductor pattern layer 700 is not particularly limited.

The data wiring (SE and DE) may be disposed on the semiconductor pattern layer 700. The data wiring (SE and DE) includes the source electrode SE and the drain electrode DE.

The drain electrode DE may be spaced apart from the source electrode SE and may face the source electrode SE over the semiconductor pattern layer 700 with the gate electrode GE or the channel portion CH interposed therebetween. The drain electrode DE may be placed in contact with, and electrically connected to, a pixel electrode PE that will be described later.

The data wiring (SE and DE) may have a single film structure or a multi-film structure including nickel (Ni), cobalt (Co), Ti, Ag, Cu, Mo, Al, beryllium (Be), niobium (Nb), gold (Au), iron (Fe), selenium (Se), or Ta. The data wiring (SE and DE) may include an alloy including at least one selected from the group consisting of Ti, Zr, tungsten (w), Ta, Nb, platinum (Pt), Hf, oxygen (O), and nitrogen (N), but the material of the data wiring (SE and DE) is not particularly limited.

A second passivation film PASSI2 may be disposed on the data wiring (SE and DE) and the semiconductor pattern layer 700. The second passivation film PASSI2 may be formed of an inorganic insulating material or an organic insulating material.

The second passivation film PASSI2 may include a contact hole CNT, which exposes at least part of the drain electrode DE.

The pixel electrode PE may be disposed on the second passivation film PASSI2. The pixel electrode PE may be electrically connected to the drain electrode DE via the contact hole CNT.

In one exemplary embodiment, the pixel electrode PE may be formed of a transparent conductor such as indium tin oxide (ITO) or indium zinc oxide (IZO) or a reflective conductor such as Al.

FIG. 3 illustrates an example in which the pixel electrode PE has the shape of a flat plate, but the shape of the pixel electrode PE is not particularly limited. That is, in another example, the pixel electrode PE may have a structure with one or more slits. In yet another example, a plurality of pixel electrodes PE may be provided, in which case, the plurality of pixel electrodes PE may be provided with different voltages.

A second substrate 1000 may be disposed to face the first substrate 500. The second substrate 1000 may be formed of a material having heat resistance and transparency. The second substrate 1000 may be formed of, for example, transparent glass or plastic, but the material of the second substrate 1000 is not particularly limited.

A black matrix BM and a wavelength conversion layer WC may be disposed on the second substrate 1000.

The black matrix BM may overlap with the above-mentioned TFT.

The black matrix BM may block light incident thereupon from the outside or prevent light from being emitted from the inside. The black matrix BM may be formed of a photosensitive resin including a black pigment, but the material of the black matrix BM is not particularly limited. That is, any substance having physical properties for blocking incident light from the outside may be used as the material of the black matrix BM.

The wavelength conversion layer WC may be disposed on a part of the second substrate 1000 not covered with the black matrix BM, i.e., a part of the second substrate 1000 exposed by the black matrix BM. The wavelength conversion layer WC may convert the wavelength of light transmitted through a liquid crystal layer LC and a second polarizing layer POL2 that will be described later. That is, the wavelength conversion layer WC may convert the wavelength of light transmitted through the liquid crystal layer LC and the second polarizing layer POL2, thereby allowing light transmitted through the wavelength conversion layer WC to appear a particular color. In one exemplary embodiment, the wavelength conversion layer WC may include quantum dots.

In another exemplary embodiment, the wavelength conversion layer WC may be replaced with a color filter that only allows the transmission of light of a particular color therethrough.

An overcoat film OC may be disposed on the wavelength conversion layer WC and the black matrix BM. The overcoat film OC may include an organic insulating material or an inorganic insulating material. The overcoat film OC may be formed on the entire second substrate 1000 and may serve as a planarization film. FIG. 3 illustrates an example in which the overcoat film OC is a single film, but the exemplary embodiments are not limited thereto. That is, in another example, the overcoat film OC may be a multi-film including two or more films. In yet another example, the overcoat film OC may not be provided.

The second polarizing layer POL2 may be disposed on the overcoat film OC. The second polarizing layer POL2 may polarize light provided from a backlight unit BLU and then transmitted through the liquid crystal layer LC. Specifically, the second polarizing layer POL2 may transmit light vibrating in a particular direction, among beams of light transmitted through the liquid crystal layer LC, and may reflect the rest of the light transmitted through the liquid crystal layer LC.

The direction in which the light that the second polarizing layer POL2 transmits therethrough vibrates may be the same as, or different from, the direction in which the light that the first polarizing layer POL1 transmits therethrough. For example, in an exemplary embodiment where the first polarizing layer POL1 transmits light vibrating in a first direction therethrough, the second polarizing layer POL2 may transmit light vibrating in a second direction (for example, a direction perpendicular to the first direction), which is different from the first direction, therethrough.

A third passivation film PASSI3 may be disposed on the second polarizing layer POL2. The third passivation film PASSI3 may be a planarization film.

A common electrode CE may be disposed on the third passivation film PASSI3. The common electrode CE may be a non-patterned full-surface electrode. A common voltage may be applied to the common electrode CE. When different voltages are applied to the common electrode CE and the pixel electrode PE, a uniform electric field may be formed between the common electrode CE and the pixel electrode PE.

The liquid crystal layer LC in which a plurality of liquid crystal molecules are provided may be disposed between the first and second substrates 500 and 1000. The liquid crystal layer LC may be controlled by the electric field formed between the common electrode CE and the pixel electrode PE, and the motion of the liquid crystal molecules included in the liquid crystal layer LC may be controlled, thereby controlling light necessary for displaying an image.

Referring again to FIG. 1, a plurality of substrate signal pads SSP may be disposed on the first side surface 500_S. The substrate signal pads SSP may be formed of a conductive material such as a metal. In one exemplary embodiment, the substrate signal pads SSP may be formed of the same material as the upper signal lines SSL_H. The substrate signal pads SSP may be electrically connected to the upper signal lines SSL_H.

In one exemplary embodiment, the substrate signal pads SSP may be electrically connected to the upper signal lines SSL_H via the side signal lines SSL_V, which are disposed on the first side surface 500_S.

The side signal lines SSL_V may be formed of a conductive material such as a metal. In one exemplary embodiment, the side signal lines SSL_V may be formed of the same material as the substrate signal pads SSP. The side signal lines SSL_V may be integrally formed with the substrate signal pads SSP.

The side signal lines SSL_V may have a smaller width than the substrate signal pads SSP. In other words, the substrate signal pads SSP may be disposed at first ends of the side signal lines SSL_V and may be expansions of the side signal lines SSL_V. In other words, the side signal lines SSL_V may extend from the substrate signal pads SSP and may have a smaller width than the substrate signal pads SSP.

In one exemplary embodiment, the side signal lines SSL_V and the substrate signal pads SSP may extend in a longitudinal direction. In one exemplary embodiment, the longitudinal direction may be a z-axis direction of FIG. 1.

In order to electrically connect the side signal lines SSL_V and the upper signal lines SSL_H, the side signal lines SSL_V and the upper signal lines SSL_H may be placed in physical contact with each other at the boundary between the top surface 500_U and the first side surface 500_S. Accordingly, the side signal lines SSL_V, the upper signal lines SSL_H, and the substrate signal pads SSP may be electrically connected.

FIG. 2 illustrates an example in which the substrate signal pads SSP are electrically connected to the upper signal lines SSL_H via the side signal lines SSL_V, but the exemplary embodiments are not limited to this example.

In another example, the side signal lines SSL_V may not be provided, in which case, the substrate signal pads SSP and the upper signal lines SSL_H may be placed in direct contact with, and electrically connected, to each other. To this end, the substrate signal pads SSP may extend to the boundary between the first side surface 500_S and the top surface 500_U.

Referring again to FIG. 1, in one exemplary embodiment, the substrate signal pads SSP may be disposed along an x-axis direction. The substrate signal pads SSP may be spaced apart from one another.

Referring to FIG. 1, the second substrate 1000 may have a second side surface 1000_S, which is substantially aligned and flush with the first side surface 500_S of the first substrate 500. In other words, the first and side surfaces 500_S and 1000_S may be disposed in substantially the same plane.

That is, the second side surface 1000_S may be understood as referring to one of a plurality of side surfaces of the second substrate 1000.

The substrate dummy pads SDP may be disposed on the second side surface 1000_S. The substrate dummy pads SDP may be formed of a conductive material such as a metal.

In one exemplary embodiment, the substrate dummy pads SDP may be formed of the same material as the substrate signal pads SSP. The substrate dummy pads SDP may be spaced apart, and insulated, from the substrate signal pads SSP.

In one exemplary embodiment, a plurality of substrate dummy pads SDP may be provided. In this case, the substrate dummy pads SDP may be disposed along the x-axis direction and may be spaced apart from one another.

In one exemplary embodiment, the substrate dummy pads SDP may be bonded and/or electrically connected to circuit dummy pads CDP that will be described later, but may be island-shaped patterns for other elements.

However, the exemplary embodiments are not limited to this configuration. For example, in another exemplary embodiment, some of the substrate dummy pads SDP may be electrically connected to elements for performing particular functions, other than the circuit dummy pads CDP.

The substrate dummy pads SDP and the substrate signal pads SSP may be electrically insulated from each other. To this end, the substrate dummy pads SDP and the substrate signal pads SSP may be physically separated from each other.

If the substrate dummy pads SDP and the substrate signal pads SSP are physically connected, a short circuit may occur in electrodes disposed between the first and second substrates 500 and 1000. If the substrate dummy pads SDP and the substrate signal pads SSP are physically separated, the occurrence of a short circuit can be prevented in the electrodes disposed between the first and second substrates 500 and 1000, in the substrate dummy pads SDP, and/or in the substrate signal pads SSP, and as a result, the occurrence of driving defects can be reduced or prevented.

In one exemplary embodiment, the circuit film CF may be disposed to face the first and second side surfaces 500_S and 1000_S. The circuit film CF may be in the shape of a thin plate and may provide a space for elements that will be described later.

In one exemplary embodiment, the circuit film CF may include an organic insulating material such as PI or an inorganic insulating material.

In one exemplary embodiment, the circuit film CF may be flexible. Thus, the circuit film CF may be at least partially foldable, bendable, or rollable.

The circuit dummy pads CDP, the circuit signal pads CSP, the circuit signal lines CSL, a driver integrated circuit IC may be disposed on the circuit film CF.

The circuit dummy pads CDP may be formed of a conductive material such as a metal. The circuit dummy pads CDP may be electrically connected to the substrate dummy pads SDP. The circuit dummy pads CDP may be island patterns not connected to other elements than the substrate dummy pads SDP.

In one exemplary embodiments, a plurality of circuit dummy pads CDP may be provided. The circuit dummy pads CDP may be disposed along the x-axis direction and may be spaced apart from one another.

The circuit dummy pads CDP may be disposed at locations corresponding to the substrate dummy pads SDP. In one exemplary embodiment, the circuit dummy pads CDP may correspond one-to-one with the substrate dummy pads SDP.

The circuit signal pads CSP may be disposed on the circuit film CF to be spaced apart from the circuit dummy pads CDP. The circuit signal pads CSP may be formed of a conductive material such as a metal. The circuit signal pads CSP may be electrically connected to the substrate signal pads SSP.

In one exemplary embodiment, a plurality of circuit signal pads CSP may be provided. The circuit signal pads CSP may be disposed along the x-axis direction and may be spaced apart from one another.

The circuit signal pads CSP may be disposed at locations corresponding to the substrate signal pads SSP. In one exemplary embodiment, the circuit signal pads CSP may correspond one-to-one with the substrate signal pads SSP.

The driver integrated circuit IC may be disposed on one side of the circuit film CF. The driver integrated circuit IC may generate signals necessary for driving the display area DA.

The circuit signal pads CSP may be electrically connected to the driver integrated circuit IC. To this end, a plurality of circuit signal lines CSL may be disposed between the circuit signal pads CVSP and the driver integrated circuit IC. The circuit signal lines CSL may be connected to the circuit signal pads CSP and the driver integrated circuit IC and may serve as paths via which signals are transmitted between the circuit signal pads CSP and the driver integrated circuit IC.

That is, signals generated by the driver integrated circuit IC may be provided to the display area DA via the circuit signal pads CSP, the substrate signal pads SSP, and the upper signal lines SSL_H.

The substrate dummy pads SDP and the circuit dummy pads CDP may be electrically connected to each other, but may be insulated from the display area DA.

The circuit signal pads CSP and the substrate signal pads SSP, and/or the circuit dummy pads CDP and the substrate dummy pads SDP, may be electrically connected via an anisotropic conductive film ACF, and this will hereinafter be described with reference to FIGS. 4 and 5.

Referring to FIGS. 4 and 5, an anisotropic conductive film ACF may be interposed between the circuit film CF and the first and second substrates 500 and 1000. The anisotropic conductive film ACF may electrically connect the first and second substrates 500 and 1000 and the circuit film CF.

Although not specifically illustrated, the anisotropic conductive film ACF may include an adhesive resin and a plurality of conductive balls scattered in the adhesive resin. The first and second substrates 500 and 1000 and the circuit film CF may be bonded and electrically connected by interposing the anisotropic conductive film ACF between the side surfaces 500_S, 1000_S (having the first and second substrates 500 and 1000) and the circuit film CF and pressing the anisotropic conductive film ACF therebetween.

Specifically, the anisotropic conductive film ACF may be interposed between the circuit dummy pads CDP and the substrate dummy pads SDP. The circuit dummy pads CDP may be electrically connected to their respective substrate dummy pads SDP by interposing the anisotropic conductive film ACF between the circuit dummy pads CDP and the substrate dummy pads SDP and pressing the anisotropic conductive film ACF therebetween.

Also, the anisotropic conductive film ACF may be interposed between the circuit signal pads CSP and the substrate signal pads SSP. The circuit signal pads CSP may be electrically connected to their respective substrate signal pads SSP by interposing the anisotropic conductive film ACF between the circuit signal pads CSP and the substrate signal pads SSP and pressing the anisotropic conductive film ACF therebetween.

As described above, the circuit signal pads CSP may be electrically connected to the driver integrated circuit IC disposed on the circuit film CF. Thus, the signals generated by the driver integrated circuit IC may be provided to the display area DA via the circuit signal lines CSL, the circuit signal pads CSP, the substrate signal pads CSP, the side signal lines SSL_V, and the upper signal lines SSL_H.

As described above, in a case where the circuit film CF where the driver integrated circuit IC is disposed in a position other than on the planar upper surface of the display substrate, such as on the sides of the first and second substrates 500 and 1000, the size of the non-display area NDA can be considerably reduced. Accordingly, a display device having a narrow bezel can be realized.

However, when the circuit film CF is attached on the sides of the first and second substrates 500 and 1000, the adhesion of the circuit film CF to the first and second substrates 500 and 1000 may become unstable because of the narrow space on the sides of the first and second substrates 500 and 1000. By coupling not only the substrate signal pads SSP and the circuit signal pads CSP, but also the circuit dummy pads CDP and the substrate dummy pads SDP, using the anisotropic conductive film ACF, the first and second substrates 500 and 1000 and the circuit film CF can be stably bonded together, i.e., the bonding force between the first and second substrates 500 and 1000 and the circuit film CF can be improved.

Accordingly, a display device having a narrow bezel and improved durability can be realized.

Figure 6:
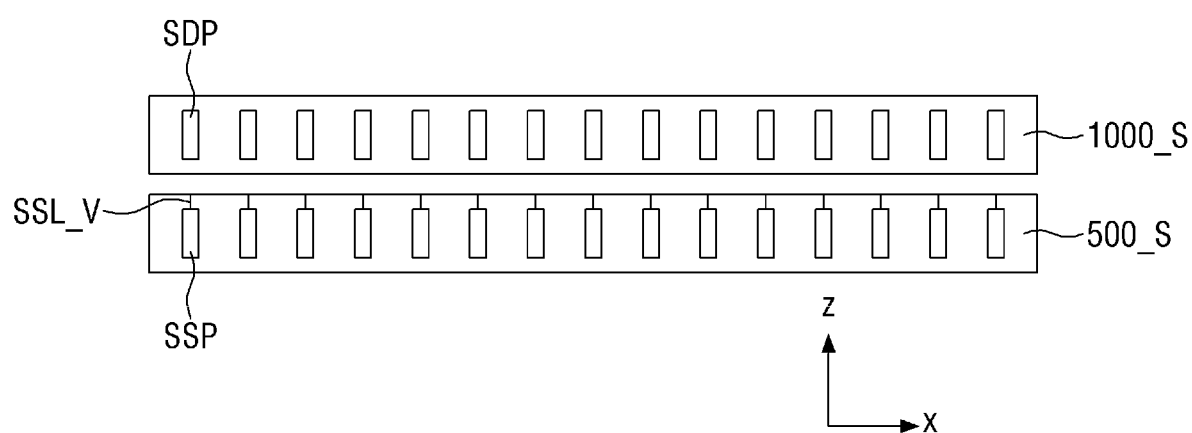
FIG. 6 is a side view of the display device constructed according to an exemplary embodiment of the invention.

FIG. 6 is a side view of the display device constructed according to an exemplary embodiment of the invention.

Specifically, FIG. 6 illustrates the first and second side surfaces 500_S and 1000_S.

In one exemplary embodiment, the number of substrate signal pads SSP may be the same as the number of substrate dummy pads SDP.

The substrate signal pads SSP may be aligned with their respective substrate dummy pads SDP in a z-axis direction.

That is, the substrate signal pads SSP and the substrate dummy pads SDP may extend in the longitudinal direction. In one exemplary embodiment, the longitudinal direction may be a z-axis direction of FIG. 6.

The substrate dummy pads SDP may be electrically connected to the circuit dummy pads CDP of the circuit film CF. Accordingly, the circuit dummy pads CDP may have substantially the same alignment and shape as the substrate dummy pads SDP, and this directly applies to other exemplary embodiments of the invention that will hereinafter be described.

A display device according to another exemplary embodiment of the invention will hereinafter be described. Some elements or features that will hereinafter be described may be substantially identical to their respective counterparts of the previous exemplary embodiment of the invention, and thus, detailed descriptions thereof will be omitted to avoid redundancy.

Figure 7:
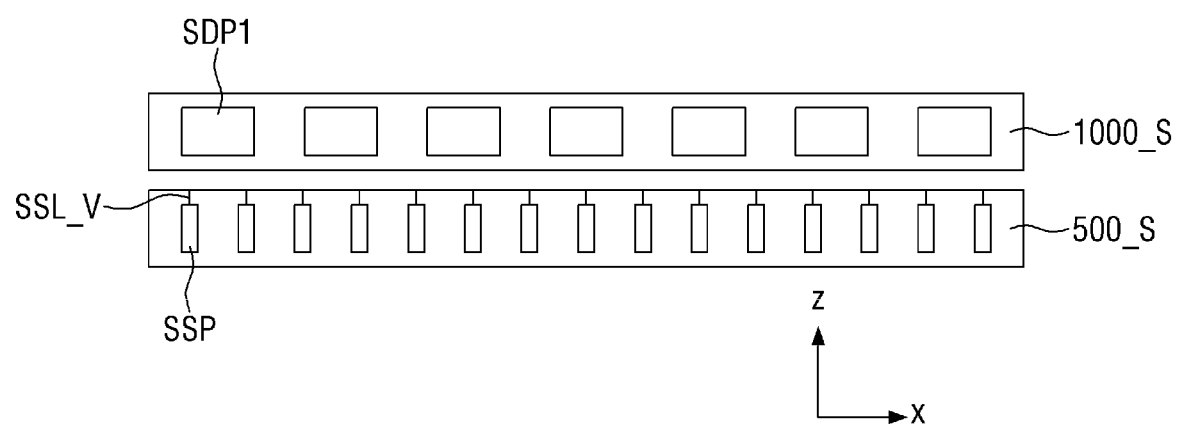
FIG. 7 is a side view of a display device constructed according to another exemplary embodiment of the invention.

FIG. 7 is a side view of a display device constructed according to another exemplary embodiment of the invention. Specifically, FIG. 7 illustrates a modified example of the display device according to the exemplary embodiment of FIG. 6.

In one exemplary embodiment, substrate dummy pads SDP1 may have a larger width than substrate signal pads SSP. The width of the substrate dummy pads SDP1 or the substrate signal pads SSP may refer to the width, in an x-axis direction of FIG. 7, of the substrate dummy pads SDP1 or the substrate signal pads SSP.

The number of substrate dummy pads SDP1 may be smaller than the number of substrate signal pads SSP. Circuit dummy pads CDP may have a shape corresponding to the substrate dummy pads SDP1. Accordingly, in one exemplary embodiment, the number of circuit dummy pads CDP may be the same as the number of substrate dummy pads SDP, and the number of circuit dummy pads CDP may be smaller than the numbers of circuit signal pads CSP and substrate signal pads SSP.

As described above, the substrate dummy pads SDP1 may be connected to the circuit dummy pads CDP via an anisotropic conductive film ACF. In the exemplary embodiment of FIG. 7, if the substrate dummy pads SDP1 are further widened, the bonding force between the circuit dummy pads CDP and the substrate dummy pads SDP1 may further increase.

Figure 8:
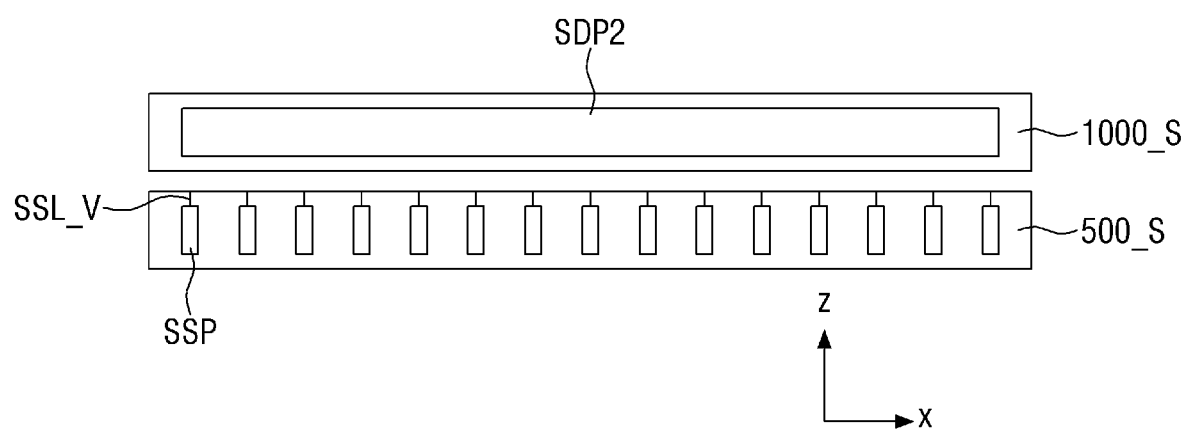
FIG. 8 is a side view of a display device constructed according to another exemplary embodiment of the invention.

FIG. 8 is a side view of a display device constructed according to another exemplary embodiment of the invention. Specifically, FIG. 8 illustrates a modified example of the display device according to the exemplary embodiment of FIG. 6. Referring to FIG. 8, a single substrate dummy pad SDP2 may be provided and may be in the shape of a bar extending in a longitudinal direction.

In one exemplary embodiment, the longitudinal direction may be an x-axis direction of FIG. 8.

In a case where a single substrate dummy pad SDP2 is provided, one or more circuit dummy pads CDP may be provided. That is, only one circuit dummy pad CDP may be provided to correspond to the substrate dummy pad SDP2, or a plurality of circuit dummy pads CDP may be provided along the direction in which the substrate dummy pad SDP2 extends in direction x.

In a case where a single substrate dummy pad SDP2 is provided, as illustrated in FIG. 8, the bonding force between the substrate dummy pad SDP2 and the circuit dummy pad(s) CDP may increase. Accordingly, first and second substrates 500 and 1000 and a circuit film CF can be further stably bonded together.

Figure 9:
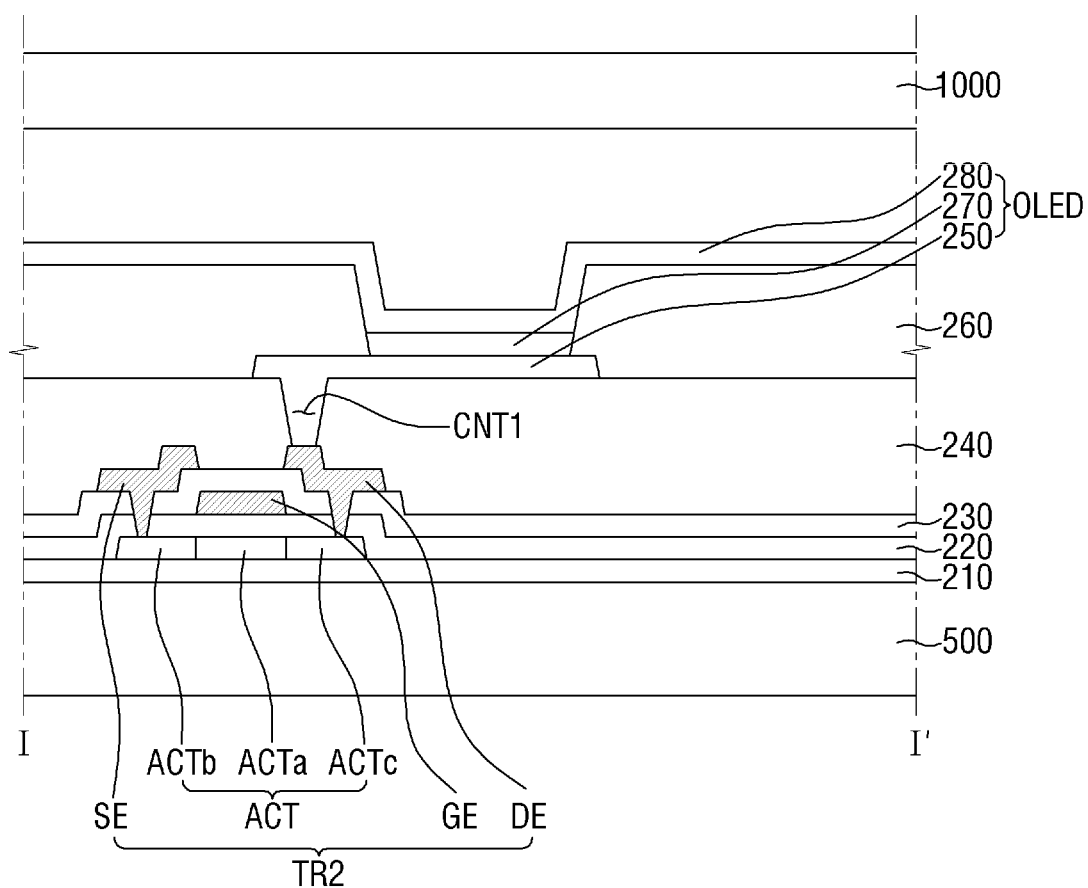
FIG. 9 is a cross-sectional view of a display device constructed according to another exemplary embodiment of the invention.

FIG. 9 is a cross-sectional view of a display device constructed according to another exemplary embodiment of the invention.

Referring to FIG. 9, the display device according to another exemplary embodiment of the invention may be an organic light-emitting display device. In this case, an organic light-emitting diode (OLED) may be disposed between first and second substrates 500 and 1000. FIG. 9 is a partial cross-sectional view of a pixel PX defined between the first and second substrates 500 and 1000.

The pixel PX may include a buffer layer 210. The buffer layer 210 may be disposed on the first substrate 500. The buffer layer 210 may prevent the infiltration of moisture and oxygen from the outside through the first substrate 500. Also, the buffer layer 210 may planarize the surface of the first substrate 500. In one exemplary embodiment, the buffer layer 210 may include one of a silicon nitride (SiNx) film, a silicon oxide (SiO$_2$) film, and a silicon oxynitride (SiOxNy) film. The buffer layer 210 may not be provided depending on the type of the first substrate 500 or processing conditions for the first substrate 500.

A semiconductor layer including a semiconductor pattern ACT may be disposed on the buffer layer 210. The semiconductor layer, particularly, the semiconductor pattern ACT, will hereinafter be described. In one exemplary embodiment, the semiconductor pattern ACT may be formed by mixing one or two selected from among polycrystalline silicon, monocrystalline silicon, low-temperature polycrystalline silicon, amorphous silicon, and an oxide semiconductor. In one exemplary embodiment, the semiconductor pattern ACT may include a channel area ACTa, which is not doped with impurities, and source and drain areas ACTb and ACTc, which are doped with impurities. The source area ACTb is disposed on one side of the channel area ACTa and is electrically connected to a source electrode SE, which will be described later. The drain area ACTc is disposed on the other side of the channel area ACTa and is electrically connected to a drain electrode DE, which will be described later.

A first insulating layer 220 may be disposed on the semiconductor layer including the semiconductor pattern ACT. In one exemplary embodiment, the first insulating layer 220 may be a gate insulating layer. In one exemplary embodiment, the first insulating layer 220 may be formed by mixing at least one selected from the group consisting of an inorganic insulating material such as SiOx or SiNx and an organic insulating material such as BCB, an acrylic material, or PI.

A gate conductor including a gate electrode GE may be disposed on the first insulating layer 220. The gate electrode GE may overlap with the semiconductor pattern ACT. The gate conductor may include at least one of an Al-based metal including an Al alloy, an Ag-based metal including an Ag alloy, a Cu-based metal including a Cu alloy, a Mo-based metal including a Mo alloy, Cr, Ti, and Ta.

A second insulating layer 230 may be disposed on the gate conductor including the gate electrode GE. The second insulating layer 230 may be formed by mixing at least one selected from the group consisting of an inorganic insulating material such as silicon oxide (SiOx) or SiNx and an organic insulating material such as BCB, an acrylic material, or PI.

A data conductor including the source electrode SE and the drain electrode DE may be disposed on the second insulating layer 230. The source electrode SE and the drain electrode DE may be disposed on the second insulating layer 230 to be spaced apart from each other. The data conductor may include at least one selected from the group consisting of a metal, an alloy, a metal nitride, a conductive metal oxide, and a transparent conductive material. In one exemplary embodiment, the data conductor may include Ni, Co, Ti, Ag, Cu, Mo, Al, Be, Nb, Au, Fe, Se, or Ta and may have a single- or multilayer structure. Alternatively, an alloy of at least one selected from the group consisting of Ti, Zr, W, Ta, Nb, Pt, Hf, 0, and N may be used as the material of the source electrode SE and the drain electrode DE.

The semiconductor pattern ACT, the gate electrode GE, the source electrode SE, and the drain electrode DE may form a switching element TR2. FIG. 3 illustrates an example in which the switching element TR2 is of a top-gate-type, but the exemplary embodiments are not limited thereto. That is, alternatively, the switching element TR2 may be of a bottom-gate-type.

A planarization layer 240 may be disposed on the data conductor. The planarization layer 240 eliminates any height difference therebelow and can thus improve the emission efficiency of a pixel electrode 250 and an organic light-emitting layer 270, which will be described later. In one exemplary embodiment, the planarization layer 240 may include an organic material. In one example, the planarization layer 240 may include at least one selected from among PI, polyacryl, and polysiloxane. In another example, the planarization layer 240 may include an inorganic material or the combination of an inorganic material and an organic material. A first contact hole CNT1 may be formed in the planarization layer 240 to at least partially expose the drain electrode DE.

The pixel electrode 250 may be disposed on the planarization layer 240. The pixel electrode 250 may be electrically connected to part of the drain electrode DE exposed by the first contact hole CNT1. That is, the pixel electrode 250 may be an anode, which is a hole injection electrode. In a case where the pixel electrode 250 is an anode electrode, the pixel electrode 250 may include a material having a high work function so as to facilitate the injection of holes. Also, the pixel electrode 250 may be a reflective electrode, a transflective electrode, or a transmissive electrode. In one exemplary embodiment, the pixel electrode 250 may include a reflective material. In one exemplary embodiment, the reflective material may include at least one selected from the group consisting of Ag, magnesium (Mg), Cr, Au, Pt, Ni, Cu, W, Al, Al-lithium (Al—Li), Mg-indium (Mg—In), and Mg—Ag.

In one exemplary embodiment, the pixel electrode 250 may be formed as a single layer, but the exemplary embodiments are not limited thereto. That is, alternatively, the pixel electrode 250 may be formed as a multilayer having a stack of two different materials.

In one exemplary embodiment, in a case where the pixel electrode 250 is formed as a multilayer, the pixel electrode 250 may include a reflective film and a transparent or transflective electrode disposed on the reflective film. In another exemplary embodiment, the pixel electrode 250 may include a reflective film and a transparent or transflective electrode disposed below the reflective film. For example, the pixel electrode 250 may have a triple-layer structure of ITO/Ag/ITO, but the exemplary embodiments are not limited thereto.

Here, the transparent or transflective electrode may include at least one selected from the group consisting of ITO, indium zinc oxide (IZO), ZnO, indium oxide ($In_2O_3$), indium gallium oxide (IGO), and Al-doped zinc oxide (AZO).

A pixel defining film 260 may be disposed on the pixel electrode 250. The pixel defining film 260 may include an opening, which at least partially exposes the pixel electrode 250. The pixel defining film 260 may include an organic material or an inorganic material. In one exemplary embodiment, the pixel defining film 260 may include photoresist, a PI-based resin, an acrylic resin, a silicon compound, or a polyacrylic resin.

The organic light-emitting layer 270 may be disposed on the pixel electrode 250 and the pixel defining film 260. Specifically, the organic light-emitting layer 270 may be disposed on part of the pixel electrode 250 exposed by the opening of the pixel defining film 260. In one exemplary embodiment, the organic light-emitting layer 270 may at least partially cover the sidewalls of the pixel defining film 260.

In one exemplary embodiment, the organic light-emitting layer 270 may emit one of red, blue, and green colors. In another exemplary embodiment, the organic light-emitting layer 270 may emit a white color or one of cyan, magenta, and yellow colors. In a case where the organic light-emitting layer 270 emits a white color, the organic light-emitting layer 270 may include a white light-emitting material or may have a stack of red, green, and blue light-emitting layers.

A common electrode 280 may be disposed on the organic light-emitting layer 270 and the pixel defining film 260. In one exemplary embodiment, the common electrode 280 may be formed on the entire surfaces of the organic light-emitting layer 270 and the pixel defining film 260. In one exemplary embodiment, the common electrode 280 may be a cathode. In one exemplary embodiment, the common electrode 280 may include at least one selected from the group consisting of Li, calcium (Ca), lithium fluoride (LiF)/Ca, LiF/Al, Al, Ag, and Mg. The common electrode 280 may be formed of a material with a low work function. In one exemplary embodiment, the common electrode 280 may be a transparent or transflective electrode formed of at least one selected from the group consisting of ITO, IZO, ZnO, $In_2O_3$, IGO, and AZO.

The pixel electrode 250, the organic light-emitting layer 270, and the common electrode 280 may form an organic light-emitting diode (OLED) "OLED", but the exemplary embodiments are not limited thereto. That is, the OLED "OLED" may have a multilayer structure including a hole injection layer (HIL), a hole transport layer (HTL), an electron transport layer (ETL), and an electron injection layer (EIL).

A second substrate 1000 may be disposed to face the first substrate 500. The second substrate 1000 may be coupled to the first substrate 500 via an additional sealing member. In one exemplary embodiment, the second substrate 1000 may be a transparent insulating substrate. In a case where the second substrate 1000 is a transparent insulating substrate, the transparent insulating substrate may be a glass substrate, a quartz substrate, or a transparent resin substrate.

A method of manufacturing a display device according to an exemplary embodiment of the invention will hereinafter be described. Some elements or features that will hereinafter be described may be substantially identical to their respective counterparts of each of the previous exemplary embodiments of the invention, and thus, detailed descriptions thereof will be omitted to avoid redundancy.

Figure 10:
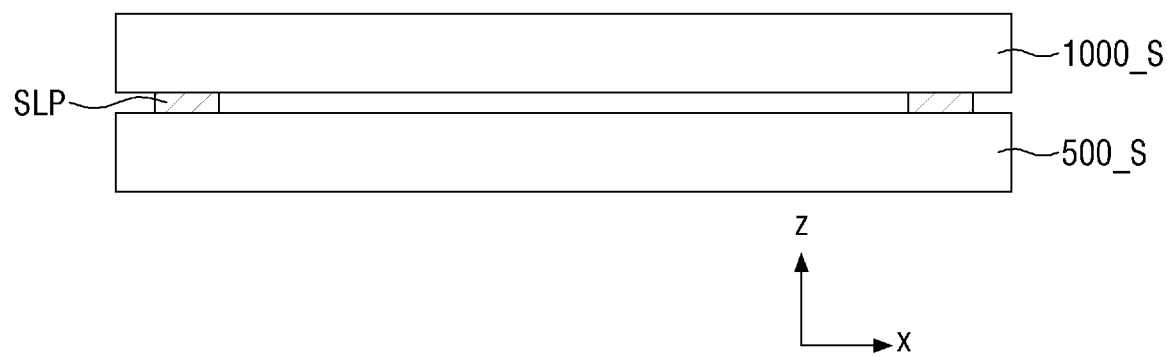
FIG. 10 is a cross-sectional view illustrating a method of manufacturing a display device according to an exemplary embodiment of the invention.
Figure 11:
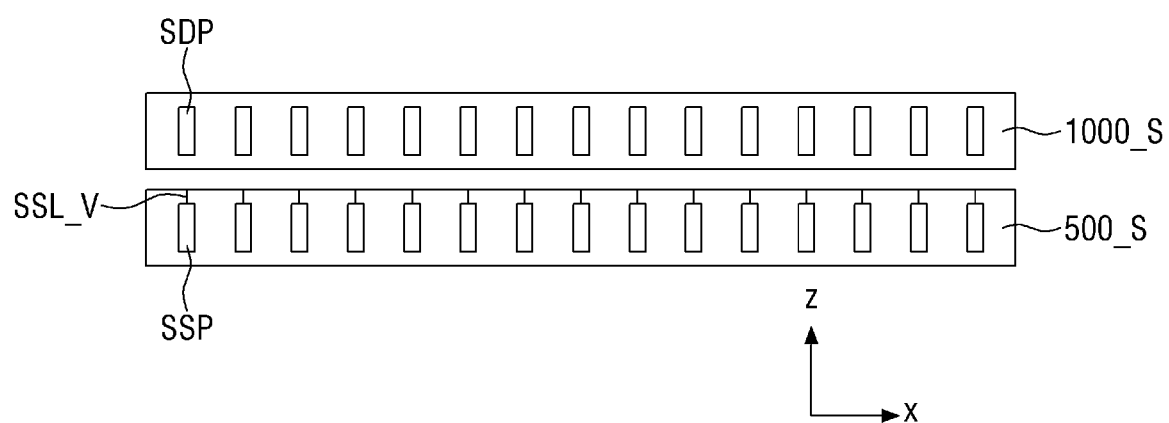
FIG. 11 is a side view illustrating the method of manufacturing a display device according to an exemplary embodiment of the invention.
Figure 12:
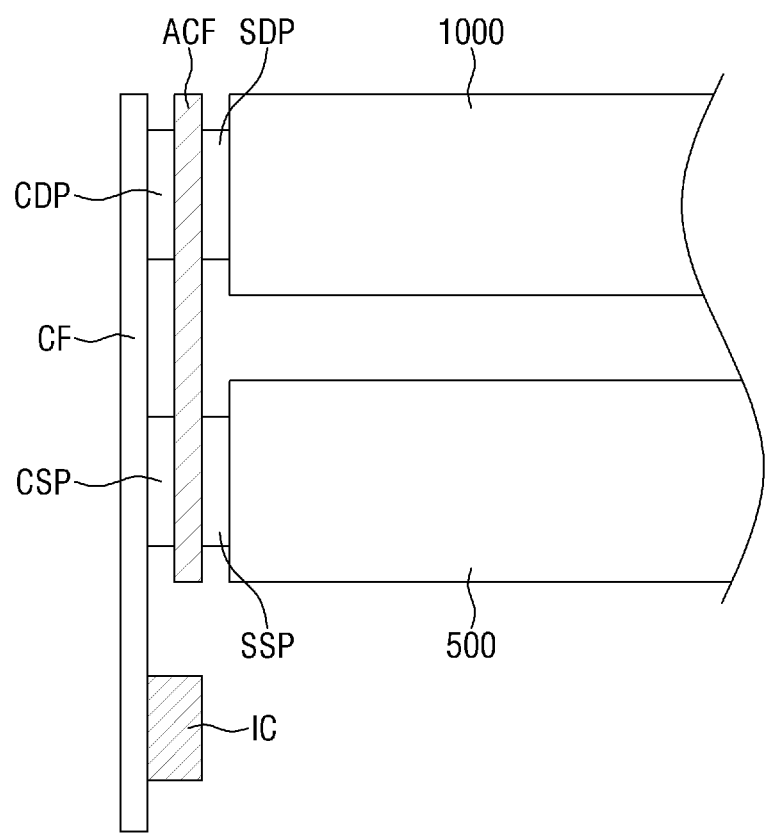
FIG. 12 is a cross-sectional view illustrating the method of manufacturing a display device according to an exemplary embodiment of the invention.

FIG. 10 is a cross-sectional view illustrating a method of manufacturing a display device according to an exemplary embodiment of the invention. FIG. 11 is a side view illustrating the method of manufacturing a display device according to an exemplary embodiment of the invention. FIG. 12 is a cross-sectional view illustrating the method of manufacturing a display device according to an exemplary embodiment of the invention.

Referring to FIGS. 10 through 12, the method of manufacturing a display device according to an exemplary embodiment of the invention includes: attaching a first substrate 500, which has a top surface 500_U and a first side surface 500_S extending from the top surface 500_U, and a second substrate 1000, which has a second side surface 1000_S aligned with the first side surface 500_S; forming substrate signal pads SSP on the first side surface 500_S and forming substrate dummy pads SDP on the second side surface 1000_S; and attaching a circuit film CF, which includes circuit signal pads CSP connected to the substrate signal pads SSP and circuit dummy pads CDP connected to the substrate dummy pads SDP, to the first and second side surfaces 500_S and 1000_S.

Referring first to FIG. 10, the first substrate 500, which has the top surface 500_U and the first side surface 500_S extending from the top surface 500_U, and the second substrate 1000, which has the second side surface 1000_S aligned with the first side surface 500_S, may be attached. The first and second substrates 500 and 1000 may be the same as their respective counterparts of any one of the display devices according to the aforementioned exemplary embodiments of the invention, and thus, detailed descriptions thereof will be omitted to avoid redundancy.

In one exemplary embodiment, the first and second substrates 500 and 1000 may be attached by interposing seal patterns SLP therebetween. In one exemplary embodiment, the seal patterns SLP may include a polymer material with adhesiveness. In an LCD device, in particular, the seal patterns SLP may seal a liquid crystal layer that may be disposed between the first and second substrates 500 and 1000.

In an organic light-emitting display device, the seal patterns SLP may include frit. That is, the first and second substrates 500 and 1000 may be attached by applying and melting frit between the first and second substrates 500 and 1000.

In another exemplary embodiment, the seal patterns SLP may be formed by partially melting the first and second substrates 500 and 1000. That is, in one exemplary embodiment, partially melted laser joining portions may be formed on the first substrate 500 and/or the second substrate 1000 by applying laser light between the first and second substrates 500 and 1000. That is, the seal patterns SLP may include laser joining portions formed by partially melting the first substrate 500 and/or the second substrate 1000.

Thereafter, referring to FIG. 11, the substrate signal pads SSP may be formed on the first side surface 500_S, and the substrate dummy pads SDP may be formed on the second side surface 1000_S.

In one exemplary embodiment, the substrate dummy pads SDP and the substrate signal pads SSP may be formed of the same material at the same time by the same process, but the exemplary embodiments are not limited thereto. That is, a method to fabricate the substrate dummy pads SDP and the substrate signal pads SSP is not particularly limited.

In one exemplary embodiment, the substrate dummy pads SDP and the substrate signal pads SSP may be formed by forming metal conductive layers on the first and second side surfaces 500_S and 1000_S and patterning the metal conductive layers.

FIG. 11 illustrates an example in which the number of substrate dummy pads SDP is the same as the number of substrate signal pads SSP and the substrate dummy pads SDP have the same shape as the substrate signal pads SSP, but the exemplary embodiments are not limited thereto. That is, in another example, the substrate dummy pads SDP and the substrate signal pads SSP may be formed as described above with regard to the exemplary embodiment of FIG. 7 or 8.

Thereafter, referring to FIG. 12, the circuit film CF, which includes the circuit signal pads CSP connected to the substrate signal pads SSP and the circuit dummy pads CDP connected to the substrate dummy pads SDP, may be attached to the first and second side surfaces 500_S and 1000_S. The circuit film CF may be substantially the same as its counterpart of any one of the display devices according to the aforementioned exemplary embodiments.

In one exemplary embodiment, the step of attaching the circuit film CF to the first and second side surfaces 500_S and 1000_S may include interposing an anisotropic conductive film ACF between the circuit film CF and the first and second side surfaces 500_S and 1000_S.

In one exemplary embodiment, the anisotropic conductive film ACF may be interposed between the circuit film CF and the first and second side surfaces 500_S and 1000_S and may then be pressed.

In this exemplary embodiment, the signal dummy pads SDP and the circuit dummy pads CDP may be electrically connected, and the substrate signal pads SSP and the circuit signal pads CSP may also be electrically connected.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a first substrate having a top surface and a first side surface extending from the top surface;
   a second substrate facing the first substrate and having a second side surface adjacent with the first side surface;
   first pads disposed on the first side surface;
   at least one second pad disposed on the second side surface;
   a circuit film facing the first and second side surfaces;
   third pads disposed on the circuit film and electrically connected to the at least one second pad; and
   fourth pads disposed on the circuit film and electrically connected to the first pads,
   wherein the first pads comprise substrate signals pads, the at least one second pad comprises at least one substrate dummy pad, the third pads comprise circuit dummy pads and the fourth pads comprise circuit signal pads.

2. The display device of claim 1, further comprising:
   an anisotropic conductive film disposed between the circuit film and the first substrate and the second substrate.

3. The display device of claim 2, wherein the third pads and the at least one second pad are electrically connected via the anisotropic conductive film.

4. The display device of claim 1, further comprising:
   upper signal lines disposed on the top surface,
   wherein the upper signal lines are electrically connected to the first pads.

5. The display device of claim 4, further comprising:
   a driver integrated circuit disposed on the circuit film and electrically connected to the fourth pads.

6. The display device of claim 5, wherein
   a display area and a non-display area are defined on the top surface, wherein the non-display area is disposed on the outside of the display area,
   the upper signal lines are disposed in the non-display area, and
   signals generated by the driver integrated circuit are provided to the display area via the fourth pads, the first pads, and the upper signal lines.

7. The display device of claim 6, wherein the at least one second pad and the third pads are insulated from the display area.

8. The display device of claim 4, further comprising:
   side signal lines extending from the first pads,
   wherein the side signal lines are placed in contact with the upper signal lines.

9. A display device comprising:
   a first substrate having a top surface and a first side surface extending from the top surface;
   a second substrate facing the first substrate and having a second side surface adjacent with the first side surface;
   first pads disposed on the first side surface;
   at least one second pad disposed on the second side surface;
   a circuit film facing the first and second side surfaces;
   third pads disposed on the circuit film and electrically connected to the at least one second pad; and
   fourth pads disposed on the circuit film and electrically connected to the first pads, wherein the at least one second pad has a larger width than the first pads.

10. The display device of claim 1, wherein the at least one second pad comprises a single bar extending in a longitudinal direction.

11. The display device of claim 1, further comprising:
    organic light-emitting diodes (OLEDs) or a liquid crystal layer disposed between the first substrate and the second substrate.

12. A method of manufacturing a display device, the method comprising the steps of:
    attaching a first substrate having a top surface and a first side surface extending from the top surface to a bottom surface, a second substrate having a second side surface adjacent with the first side surface;
    forming substrate signal pads on the first side surface and forming at least one substrate dummy pad on the second side surface; and
    attaching a circuit film, which comprises circuit signal pads connected to the substrate signal pads and circuit dummy pads connected to the at least one substrate dummy pad, to the first side surface and the second side surface.

13. The method of claim 12, wherein the step of attaching the circuit film to the first side surface and second side surface, comprises interposing an anisotropic conductive film between the circuit film and the first side surface and the second side surface.

14. The method of claim 13, wherein the circuit dummy pads and the at least one substrate dummy pad are electrically connected via the anisotropic conductive film.

15. The method of claim 12, wherein
    the display device includes upper signal lines disposed on the top surface, and
    the upper signal lines are electrically connected to the substrate signal pads.

16. The method of claim 12, wherein a driver integrated circuit, which is electrically connected to the circuit signal pads, is disposed on the circuit film.

17. The method of claim 12, wherein the at least one substrate dummy pad has a larger width than the substrate signal pads.

18. The method of claim 12, wherein the at least one substrate dummy pad comprises a single substrate dummy pad formed as a bar extending in a longitudinal direction.

19. The method of claim 12, wherein the substrate signal pads and the circuit signal pads are formed of the same material at the same time by the same process.

\* \* \* \* \*